(12) United States Patent
Nakayama et al.

(10) Patent No.: US 6,909,165 B2
(45) Date of Patent: Jun. 21, 2005

(54) OBVERSE/REVERSE DISCRIMINATIVE RECTANGULAR NITRIDE SEMICONDUCTOR WAFER

(75) Inventors: Masahiro Nakayama, Hyogo (JP); Tetsuya Hirano, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 77 days.

(21) Appl. No.: 10/658,378

(22) Filed: Sep. 10, 2003

(65) Prior Publication Data
US 2004/0188804 A1 Sep. 30, 2004

(30) Foreign Application Priority Data
Mar. 28, 2003 (JP) .......................... 2003-089935
Jul. 17, 2003 (JP) .......................... 2003-275934

(51) Int. Cl.$^7$ .......................................... H01L 23/544
(52) U.S. Cl. ..................... 257/620; 257/627; 257/797
(58) Field of Search ............................ 257/618, 620, 257/627, 628, 797

(56) References Cited

U.S. PATENT DOCUMENTS

| | | | | |
|---|---|---|---|---|
| 4,630,093 A | * | 12/1986 | Yamaguchi et al. | 428/66.7 |
| 2003/0013240 A1 | * | 1/2003 | Asano et al. | 438/168 |
| 2004/0113236 A1 | * | 6/2004 | Kurita et al. | 257/620 |
| 2004/0242001 A1 | * | 12/2004 | Toba et al. | 438/690 |

FOREIGN PATENT DOCUMENTS

| | | |
|---|---|---|
| JP | 58-71616 | 4/1983 |
| JP | 60-167426 | 8/1985 |
| JP | 2-144908 | 6/1990 |
| JP | 8-316112 | 11/1998 |
| JP | P 2000-331898 A | 11/2000 |
| JP | P 2002-222746 A | 8/2002 |
| JP | P 2002-356398 A | 12/2002 |

* cited by examiner

*Primary Examiner*—T. N. Quach
(74) *Attorney, Agent, or Firm*—McDermott Will & Emery LLP

(57) ABSTRACT

A mirror-polished obverse surface and a roughened reverse surface of the conventional GaN wafers have been discriminated by difference of roughness on the surfaces with human eyesight. The difference of the surfaces is rather ambiguous. Cracks/breaks and distortion of the wafers have been likely to occur because the roughness of the reverse surface is apt to bring fine particles.

To discern an obverse from a reverse without making use of the difference of the surface roughness, the present invention provides an obverse/reverse discriminative rectangular nitride semiconductor wafer having a longer slanting edge and a shorter slanting edge at obversely-clockwise neighboring corners, or having an asymmetric slanting edge at a corner, or having asymmetrically bevelled parts or having discriminating characters marked by laser. The present invention can make the reverse surface mirror-polished and smooth, so that particles on the reverse surface and distortion, cracks or breaks of the wafer decrease.

16 Claims, 8 Drawing Sheets normal-postural characters on obverse surface normal-postural characters on reverse surface

US 6,909,165 B2

OBVERSE/REVERSE DISCRIMINATIVE RECTANGULAR NITRIDE SEMICONDUCTOR WAFER

BACKGROUND OF THE INVENTION

1. Field of the Invention

This invention relates to a nitride semiconductor wafer carrying obverse/reverse marks for distinguishing an obverse surface from a reverse surface. Semiconductor nitrides mean gallium nitride (GaN), indium nitride (InN) and aluminum nitride (AlN). The nitrides have wide bandgaps, which give transparency to the nitrides. Gallium nitride (GaN) substrate wafers, for example, are entirely transparent for visible light. Transparency incurs difficulty about making obverse/reverse marks unlike silicon (Si) wafers or gallium arsenide (GaAs) wafers which are opaque for visible light. If a transparent wafer wears a mark on an obverse surface, one can see the mark through a transparent medium from a reverse side. If a mark is scribed on a bottom, the mark can be seen from a top. In the case of a circular wafer, an obverse surface can be distinguished from a reverse surface by making an orientation flat (OF) and identification flat (IF) by cutting two arc fragments with different lengths from a periphery. However, the technology of making GaN crystals is not fully matured. The immaturity prohibits the current technology from producing a large-sized circular GaN wafer. Available best GaN wafers are at present one inch $\phi$ (25 mm $\phi$) to two inch $\phi$ (50 mm $\phi$) at most.

This application claims the priority of Japanese Patent Application No. 2003-89935 filed on Mar. 28, 2003 and Japanese Patent Application No. 2003-275934 filed on Jul. 17, 2003, which are incorporated herein by reference.

Since round GaN wafers are difficult to produce, rectangle GaN wafers of a side of 1 cm to 2 cm are made. A rectangular wafer has four sides. One of the sides can be employed for designating a crystal orientation. Designation of crystallographical orientations is a matter beyond the present invention. In the case of rectangular wafers which have four straight-line sides, the prevalent OF/IF marking which requires cut of two arcs on the periphery is inapplicable.

2. Description of Related Art

Processing of a GaN wafer comprises a grinding (lapping) step, a shaping (chamfering, bevelling) step, a gross polishing step, a fine polishing step, and a washing step. GaN is very rigid but fragile. Rigidity forces the processing to make use of silicon carbide (SiC) or diamond (C) polishing powder. A top surface of a GaN wafer is fine-polished into a mirror flat of surface roughness Ra less than 1 nm (Ra≦1 nm) by SiC or diamond fine powder. A bottom surface is lapped into a rugged texture of large roughness Ra like frosted glass by gross powder of a mesh from #400 to #1000. The obverse surface and the reverse surface have very different roughnesses. The roughness difference enables an operator to discern an obverse surface from a reverse surface by eyesight. At present obverse/reverse discrimination is done by the conspicuous difference of roughness observed by human eyesight in the case of rectangle GaN wafers. Since eyesight can discern tops from bottoms of rectangular wafers by the roughness, no obverse/reverse discriminating mark is formed on current rectangular GaN wafers.

In the case of round wafers, designation of crystal orientations requires an orientation flat (OF). On the contrary, in the case of rectangular wafers, one side can be assigned to a mark denoting crystal orientations by giving different lengths to two parallel pairs of four sides. Thus, current rectangle GaN wafers carry neither obverse/reverse marks nor orientation marks. This is a present state of technology of processing rectangle GaN wafers.

The most prevalent obverse/reverse discriminator is a set of an OF and IF for circular wafers of Si, GaAs or InP. There are some proposals of obverse/reverse marks other than the OF/IF discriminator. Some of the proposals are described.

① Japanese Patent Laying Open NO.2-144908 (JP0244908A), "Manufacture of semiconductor device", proposed an obverse/reverse identification of a circular silicon (Si) wafer by chamfering top edges and bottom edges with different slanting angles and discerning a top from a bottom by the difference of chamfering angles. This relates not to a rectangle GaN wafer but to a round Si wafer. ① differs from the present invention in two preconditions.

② Japanese Patent Laying Open NO. 60-167426 (JP60167426A), "Semiconductor crystal wafer", proposed another obverse/reverse and orientation discriminator of a circular silicon (Si) wafer by shooting a pulsed, focused laser beam on the silicon wafer along a line extending in a predetermined orientation, and forming a series of melted dots extending in the orientation. The direction shows crystal orientations and existence or non-existence of the melted dots denotes an obverse or reverse surface.

③ Japanese Patent Laying Open No.2000-331898 (JP2000331898A), "Notched semiconductor wafer", proposed a circular silicon wafer having an orientation mark by a small notch formed on a circular circumference and an obverse/reverse mark of differentiating bevelling angles formed in the notch. ③ complained the OF/IF orientation caused asymmetric deviation of the center of gravity of a future 300 mm(12 inches) $\phi$ silicon wafer and invited accidental spin-off of the wafer from a spinning rotor.

④ Japanese Patent Laying Open No.58-71616 (JP58071616A), "Manufacture of semiconductor device", proposed an obverse/reverse discriminating mark of a circular silicon wafer with an asymmetrically bevelled circumference with different bevelling angles. ④ is similar to ①. ④ also relates not to a nitride rectangular wafer but to a circular silicon wafer.

⑤ Japanese Patent Laying Open No.8-316112 (JP08316112A), "Semiconductor wafer with notch", proposed an obverse/reverse mark of a large-sized circular silicon wafer. The obverse/reverse mark is a small notch formed on a circumference with different top and bottom bevelling angles. The position of the notch signifies crystal orientations. The difference of the bevelling angles discriminates between top and bottom. ⑤ resembles ③.

⑥ Japanese Patent Laying Open No.2002-356398 (JP2002356398A), "Gallium nitride wafer", proposed a chamfered free standing gallium nitride wafer. ⑥ declared that they had succeeded in making a small freestanding GaN plate. And ⑥ said that they had bevelled an edge of the GaN plate by a rotary whetstone. ⑥ related not to an obverse/reverse mark but to production of a GaN wafer.

A GaN single crystal is transparent for visible light. Available GaN single crystal substrates at present have a roughened reverse surface and a mirror-polished smooth obverse surface. The reverse surface looks like frosted glass. Human eye sight can discern the obverse surface from the reverse surface by the difference of the roughness. The roughness of the reverse surface causes several problems. Particles are apt to adhere to the roughened reverse surface. Some of the particles move around to the obverse surface in wafer processes and contaminate the obverse surface. The large difference of the roughness degrades flatness of the wafer and induces distortion. The wafer distortion causes errors of patterns in photolithography and causes low yield of products. Furthermore, the rugged reverse incurs occurrences of cracks in wafer processes. When the wafer is die-bonded upon a heat sink or a package, the rugged reverse surface reduces thermal conduction between the device and the heat sink/package and causes poor thermal diffusion.

Therefore, a request of mirror-flat, smooth reverse surfaces is made for GaN substrates. A flat reverse surface would reduce adhesion of particles on the reverse, would raise the heat-conduction for the heat sink and would lower the wafer distortion. If the reverse surface is polished into mirror flat, human eyesight cannot discern an obverse from a reverse. The difference of the roughness would act as an obverse/reverse discriminating mark no more. A new obverse/reverse discriminator should be required for nitride semiconductor wafers instead of the roughened reverses.

A first purpose of the present invention is to provide a rectangular nitride semiconductor single crystal wafer having an obverse/reverse discriminator without relying upon a roughened reverse surface. A second purpose of the present invention is to provide a rectangular nitride semiconductor single crystal wafer free from contamination of particles by eliminating reverse surface roughness which causes particle contamination. A third purpose of the present invention is to provide a rectangular nitride semiconductor single crystal wafer immune from a large convex or concave distortion by eliminating reverse surface roughness which causes wafer distortion. A fourth purpose of the present invention is to provide a rectangular nitride semiconductor single crystal wafer with high heat conductivity by eliminating reverse surface roughness which decreases heat conduction.

A rectangular nitride semiconductor wafer of the present invention has an obverse/reverse discriminator comprising a longer slanting edge and a shorter slanting edge formed at neighboring corners which align clockwise on an obverse surface.

Another rectangular semiconductor wafer has another obverse/reverse discriminator which is an asymmetric slanting edge which inclines to an obverse-counterclockwise neighboring side at a smaller slanting angle 5 degrees to 40 degrees and inclines to an obverse-clockwise neighboring side at a larger slanting angle 85 degrees to 50 degrees.

Another rectangular semiconductor wafer has another obverse/reverse discriminator which is different depths of chamfering.

Another rectangular semiconductor wafer has another obverse/reverse discriminator which is asymmetric characters written of an obverse surface or a reverse surface in normal or inverse posture.

An important contrivance of the present invention is obverse/reverse identification. Then, variances of obverse/reverse discriminating marks are described in detail by taking a rectangle GaN wafer as an example of nitride semiconductors.

A rectangle wafer has an obverse surface, a reverse surface and four sides. Two surfaces are anti-parallel. "Anti-parallel" means a kind of "parallel" in which normals are directed in reverse directions. This invention proposes a c-plane wafer. C-plane means a (0001) or (000-1) plane. The sides are all orthogonal to both obverse and reverse surfaces. Furthermore, sides are anti-parallel or orthogonal with each other, because the object is a rectangular wafer. When a (0001) wafer is an object, either (0001) or (000-1) plane is either an obverse surface or a reverse surface. When an obverse surface is determined to be the (0001) surface here, the reverse surface should be (000-1). When an obverse surface is determined to be (000-1), a reverse surface is (0001). This invention can be applied to both cases (0001) and (000-1) of an obverse surface. Thus, allusion to existence and orientation of a reverse surface is sometimes omitted in this description, because designation of an obverse surface can uniquely determine the orientation of a reverse surface.

The four sides are orthogonal to the obverse surface and the reverse surface. Planes or directions of nitride semiconductor crystals having hexagonal symmetry can be designated by a set of four Miller indices {hkmn}, (hkmn), [hkmn] or <hkmn>. Early three indices always satisfy a sum rule of h+k+m=0. The fourth index which denotes a c-axis part of an object plane is a unique one.

The wavy-bracketed {hkmn} is a collective plane representation. The round-bracketed (hkmn) is an individual plane representation. The key-bracketed <hkmn> is a collective direction representation. The square-bracketed [hkmn] is an individual direction representation. The individual direction [hkmn] is a normal standing on an individual plane (hkmn). Thus, the [hkmn] direction is vertical to the (hkmn) plane.

If two individual planes ($h_1$ $k_1$ $m_1$ $n_1$) and ($h_2$ $k_2$ $m_2$ $n_2$) or two individual directions [$h_1$ $k_1$ $m_1$ $n_1$] and [$h_2$ $k_2$ $m_2$ $n_2$] are orthogonal, an inner product is zero $h_1 h_2 + k_1 k_2 + m_1 m_2 + n_1 n_2 = 0$.

An object of the present invention is a rectangle wafer having two surfaces and four sides. Four sides are either anti-parallel or orthogonal. If one side is determined, other three sides are automatically determined. Since this invention restricts objects within c-plane wafers whose obverse is denoted by (0001) or (000-1), the four sides should have Miller indices (hkm0) of n=0. If one side is determined to be ($h_1$ $k_1$ $m_1$ 0), an opposite side is ($-h_1$ $-k_1$ $-m_1$ 0) due to antiparallelism and two neighboring sides are ($h_1$ $k_1$ $m_1$ 0) and ($h_2$ $k_2$ $m_2$ 0), where $h_1 h_2 + k_1 k_2 + m_1 m_2 = 0$. Hexagonal symmetry (h+k+m=0, n=0) allows four sides various Miller indices (11-20), (1-100), (22-40), (33-60), (2-200), (2-310), (2-530) and so on. If one side is (1-100), an opposite should be (-1100). An orthogonal side can be one of (11-20), (22-40), (33-60) and so on which are multiples of (11-20). Sets of (1-100) and (11-20), (1-100) and (22-40) . . . are allowable. Then, four sides which have two freedoms should be defined by determining two vertical planes. The present invention selects a set of (11-20) side and (1-100) side without choice of the multiples. Four sides are fully designated by determining two sides. In the description, orientations of two sides will be described instead of mentioning all four sides.

One of four sides is called a "reference side" which denotes crystallographical orientation exactly. Since this invention relates not to determining crystal orientations, the role of the reference side should be mentioned no more in detail.

Here, the reference side should be placed downside for identifying an obverse/reverse orientation. For the convenience of explanation, four sides are designated by a, b, c and d in a clockwise order on an obverse surface. Four corners are designated in series by α, β, γ and δ. The corners and sides align in a clockwise order of α, a, β, b, γ, c, δ and d on the obverse surface. They align in the same order counterclockwise on the reverse.

The present invention forms an obverse/reverse discriminator on a side opposite to the reference side. If the reference side is d-side, the opposite side which wears a mark is b-side. If c-side is a reference side, a-side is an opposite side.

Twelve types of the present invention are briefly described by examples.

[Type 1 (Clockwise Aligning Longer/Shorter Edges for (11-20) Reference (FIG. 1))]

A rectangular GaN wafer having a (0001) obverse surface, (11-20) and (1-100) sides, a longer slanting edge (L) and a shorter slanting edge (S) formed at neighboring corners, which align clockwise on the obverse surface, of a side opposite to a reference side (11-20). Lengths of the longer slant (L) and the shorter slant (S) should satisfy inequalities of K/40≦L≦K/12 and K/40≦S≦K/16, where K is a sum of lengths of four sides.

[Type 2 (Clockwise Aligning Longer/Shorter Edges for (1-100) Reference (FIG. 2))]

A rectangular GaN wafer having a (0001) obverse surface, (11-20) and (1-100) sides, a longer slanting edge (L) and a shorter slanting edge (S) formed at neighboring corners, which align clockwise on the obverse surface, of a side opposite to a reference side (1-100). Lengths of the longer slant (L) and the shorter slant (S) should satisfy inequalities of K/40≦L≦K/12 and K/40≦S≦K/16, where K is a sum of lengths of four sides.

[Type 3 (Asymmetric Edge for (11-20) Reference (FIG. 3))]

A rectangular GaN wafer having a (0001) obverse surface, (11-20) and (1-100) sides, an asymmetric slanting edge, which inclines to an obversely counterclockwise neighboring at Θ from 5 degrees to 40 degrees (5°≦Θ≦40°), at a left corner of a side opposite to a reference side (11-20).

[Type 4 (Asymmetric Edge for (1-100) Reference (FIG. 4))]

A rectangular GaN wafer having a (0001) obverse surface, (11-20) and (1-100) sides, an asymmetric slanting edge, which inclines to an obversely counterclockwise neighboring at Θ from 5 degrees to 40 degrees (5°≦Θ≦40°), at a left corner of a side opposite to a reference side (1-100).

[Type 5 (asymmetric obverse/reverse bevelling sides (FIG. 5))]

A rectangular GaN wafer having a (0001) surface, (11-20) and (1-100) sides which have a wider reverse bevelling width (h) and a narrower obverse bevelling width (g) (g<h). Favorable scopes of g and h are g=100 μm to 400 μm and h=300 μm to 1000 μm.

[Type 6 (asymmetric obverse/reverse round bevelling sides (FIG. 6))]

A rectangular GaN wafer having a (0001) obverse surface, (11-20) and (1-100) sides which have a wider reverse round bevelling width (h) and a narrower obverse round bevelling width(g) (g<h). Favorable scopes of g and h are g=100 μm to 400 μm and h=300 μm to 1000 μm.

[Type 7 (normal-postural characters on obverse surface (FIG. 7))]

A rectangle GaN wafer having a (0001) obverse surface, (11-20) and (1-100) sides and a series of characters written in normal posture in parallel with a reference side (11-20) in a [1-100] direction on the obverse surface by laser marking.

[Type 8 (normal-postural characters on reverse surface (FIG. 8))]

A rectangle GaN wafer having a (0001) obverse surface, (11-20) and (1-100) sides and a series of characters written in normal posture in parallel with a reference side (11-20) in a [1-100] direction on a reverse surface by laser marking.

[Type 9 (inverse-postural characters on reverse surface (FIG. 9))]

A rectangle GaN wafer having a (0001) obverse surface, (11-20) and (1-100) sides and a series of characters written in inverse posture in parallel with a reference side (11-20) in a [1-100] direction on a reverse surface by laser marking.

[Type 10 (normal-postural characters on obverse surface (FIG. 10))]

A rectangle GaN wafer having a (0001) obverse surface, (11-20) and (1-100) sides and a series of characters written in normal posture in parallel with a reference side (1-100) in a [11-20] direction on the obverse surface by laser marking.

[Type 11 (normal-postural characters on reverse surface (FIG. 11))]

A rectangle GaN wafer having a (0001) obverse surface, (11-20) and (1-100) sides and a series of characters written in normal posture in parallel with a reference side (1-100) in a [11-20] direction on a reverse surface by laser marking.

[Type 12 (inverse-postural characters on reverse surface (FIG. 12))]

A rectangle GaN wafer having a (0001) obverse surface, (11-20) and (1-100) sides and a series of characters written in inverse posture in parallel with a reference side (1-100) in a [11-20] direction on a reverse surface by laser marking.

SUMMARY OF THE INVENTION

This invention makes two length-different slanting edges at predetermined corners, or makes an asymmetric slanting edge at a predetermined corner, or gives different bevelling widths, or writes characters in normal, or inverse posture on an obverse or a reverse for discriminating the obverse or reverse surface.

Hitherto obverse/reverse identification of GaN wafers have been done by allocating roughness to a reverse surface and smoothness to an obverse surface and confirming the difference of texture by eye sight. The sense of touch would easily discern texture difference. But, rules rigorously prevent operators from touching cleaned wafers by fingers, which causes serious contamination. GaN wafers are transparent. It is difficult for human eye sight to discern rough/smooth texture of a transparent GaN wafer. This invention relies upon geometric differences which appeal to human eye sight as obverse/reverse discriminative marks instead of texture difference. The geometric differences facilitate obverse/reverse discrimination by eye-sight. Easy and reliable obverse/reverse discrimination is the most important advantage of the present invention. The present invention is also applicable to other nitride semiconductors, aluminum gallium nitride (AlGaN), aluminum nitride (AlN) and indium nitride (InN).

The present invention dispenses with roughening reverse surfaces for obverse/reverse discernment. The present invention enables wafer makers to finish reverse surfaces into mirror-polished texture. Namely, both obverses and reverses can be mirror-polished into high smoothness.

Mirror reverse surfaces decrease adhesion of particles onto the reverse surfaces. The reason why the reverse surfaces have been hitherto suffering from particle adhesion is that the reverse surfaces have been roughened by lapping for the obverse/reverse discernment. The roughness is liable to absorb and maintain fine particles. Nitride wafers of the present invention are immune from particle contamination, in particular of reverse surfaces.

Another improvement is reduction of wafer distortion. The difference of obverse/reverse roughnesses has hitherto caused big distortion of GaN wafers. The large distortion results from asymmetric obverse/reverse finishing. The present invention allows reverse surfaces to take a mirror flat similar to obverses. Similarity of finishing of obverses and reverses enables the present invention to reduce distortion of wafers. The reduction of distortion favors photolithography processing by decreasing fluctuation of mask/wafer gaps.

Properties of conventional reverse-lapping-roughened wafers and reverse-polishing-smoothed wafers of the present invention are compared. The number of particles on obverse surfaces, distortion (TTV:total thickness variation), occurrence rates of crack/break are measured. FIGS. 13, 14 and 15 show the results of the experiments.

In FIG. 13, the abscissa denotes roughness (texture) of reverse surfaces of GaN rectangular wafers and the ordinate signifies the number of particles on obverse surfaces. A left-hand shows a conventional wafer with a lapped roughened reverse surface. A right-hand designates an improved wafer with a mirror-polished reverse surface processed by the teaching of the present invention. Superficial particles reduce conspicuously in the present invention. The particle reduction results from mirror-flat reverse surfaces. This result teaches us that smoothing of reverses is effective to reduce particle adhesion on obverses. A solid slanting line shows continual reduction of superficial particle numbers as reverse smoothness rises.

FIG. 14 shows a relation between reverse roughness and distortion or TTV(total thickness variation; fluctuation of thickness). The ordinate is TTV or distortion. The abscissa is reverse roughness. Reverse-lapped roughened wafers suffer from large wafer distortion which invites pattern errors in photolithography. Reverse-polished wafers of the present invention can reduce distortion which is favorable for wafer processes.

FIG. 15 shows occurrence rates of crack/break. Rough-reverse conventional wafers are plagued with occurrence of cracks and breaks. Polished-reverse wafers of the present invention enjoy low probability of breaks and cracks. The present invention which is free from the restriction of roughening reverse surfaces has advantages of reduction of superficial particles, alleviation of distortion and decrease of occurrence of breaks and cracks.

d-sides, takes (11-20)d-side as a reference side, and has an obverse/reverse discriminating sign consisting of characters written along the (11-20) reference side in inverse posture on the reverse surface. One can discriminate the obverse surface from the reverse surface by confirming the characters scribed on the reverse surface in the inverse posture.

Figure 10:
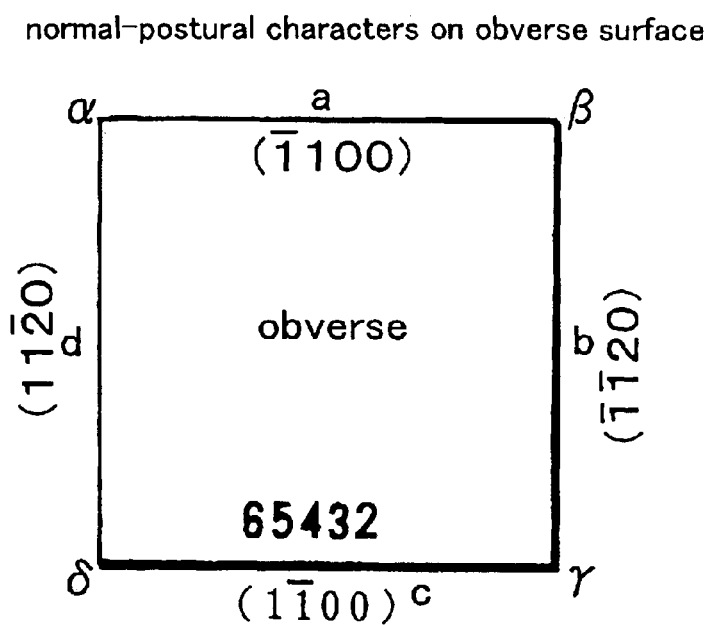

FIG. 10 is a top view of a type 10 rectangular GaN wafer which has a (0001) obverse surface, a (000-1) reverse surface, (-1100)a-, (-1-120)b-, (1-100)c- and (11-20)d-sides, takes the (1-100)c-side as a reference side, and has an obverse/reverse discriminating sign consisting of characters written along the (1-100) reference side in normal posture on the obverse surface. One can discriminate the obverse surface from the reverse surface by confirming the characters scribed on the obverse surface in the normal posture.

Figure 11:
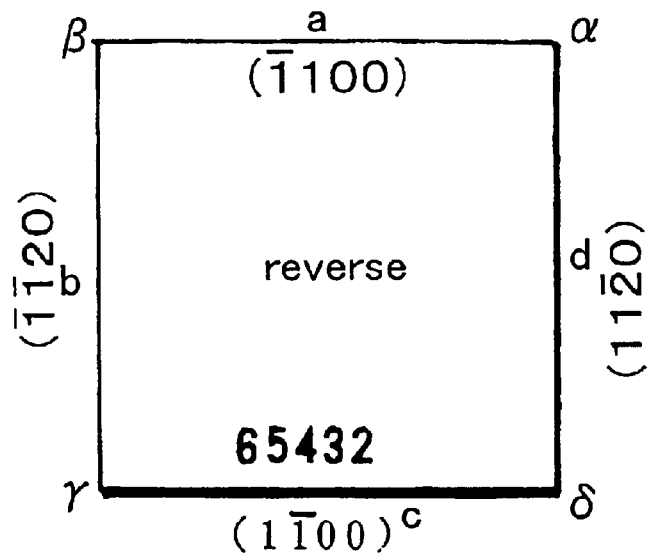

FIG. 11 is a bottom view of a type 11 rectangular GaN wafer which has a (0001) obverse surface, a (000-1) reverse surface, (-1100)a-, (-1-120)b-, (1-100)c- and (11-20)d-sides, takes (1-100)c-side as a reference side, and has an obverse/reverse discriminating sign consisting of characters written along the (1-100) reference side in normal posture on the reverse surface. One can discriminate the obverse surface from the reverse surface by confirming the characters scribed on the reverse surface in the normal posture.

Figure 12:
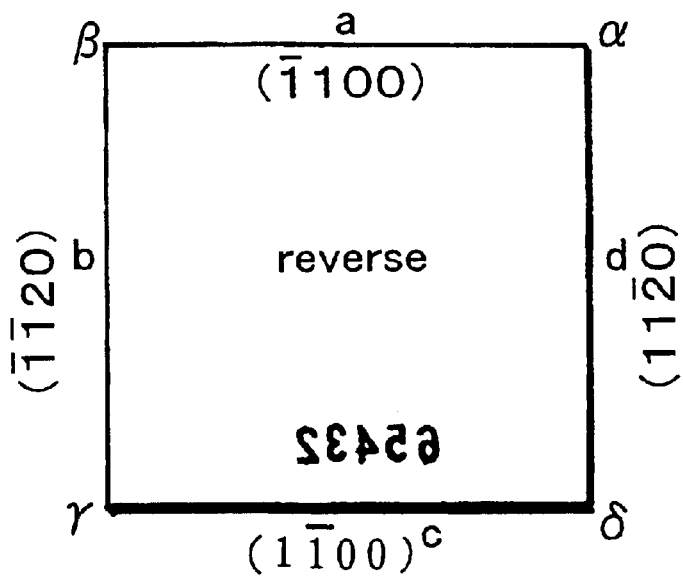

FIG. 12 is a bottom view of a type 12 rectangular GaN wafer which has a (0001) obverse surface, a (000-1) reverse surface, (-1100)a-, (-1-120)b-, (1-100)c- and (11-20)d-sides, takes (1-100)c-side as a reference side, and has an obverse/reverse discriminating sign consisting of characters written along the (1-100) reference side in inverse posture on the reverse surface. One can discriminate the obverse surface from the reverse surface by confirming the characters scribed on the reverse surface in the reverse posture.

Figure 13:
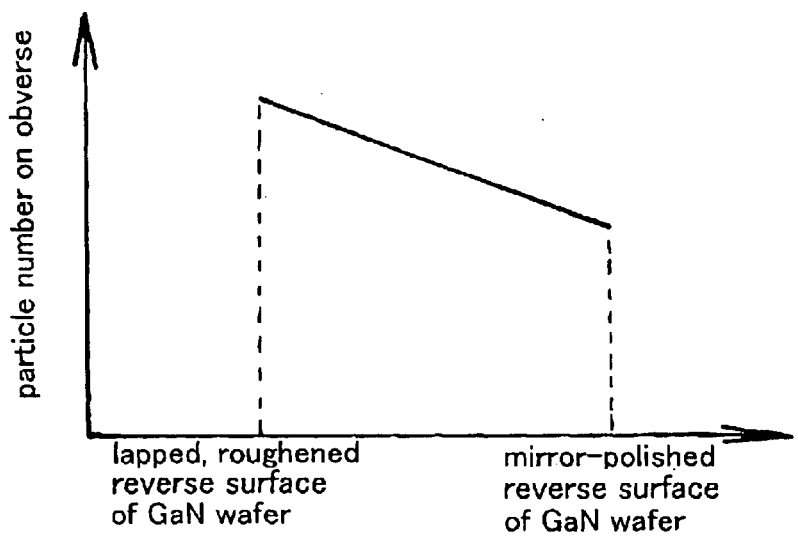

FIG. 13 is a graph showing measured particle numbers appearing on obverse surfaces of conventional reverse lapped roughened GaN wafers (left-hand) and reverse mirror-polished wafers (right-hand) of the present invention.

Figure 14:
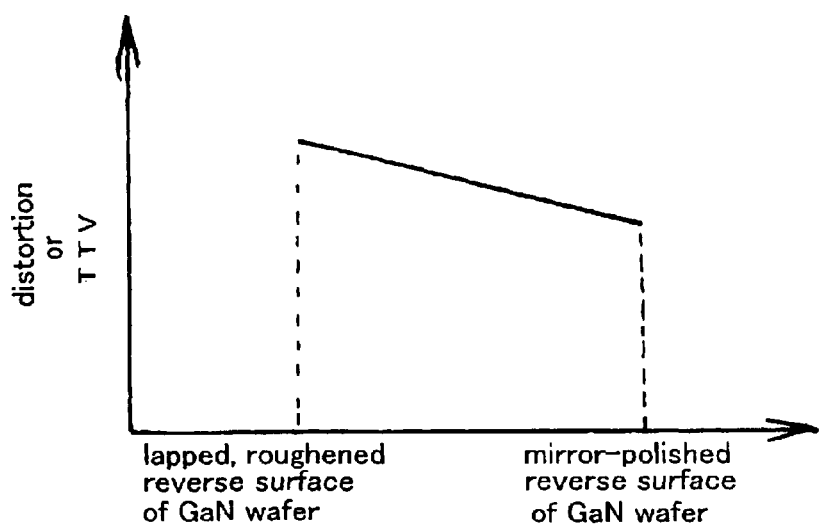

FIG. 14 is a graph showing measured distortion or TTV (total thickness variation; fluctuation of thickness) of conventional reverse lapped rough GaN wafers (left-hand) and reverse mirror-polished wafers (right-hand) of the present invention.

Figure 15:
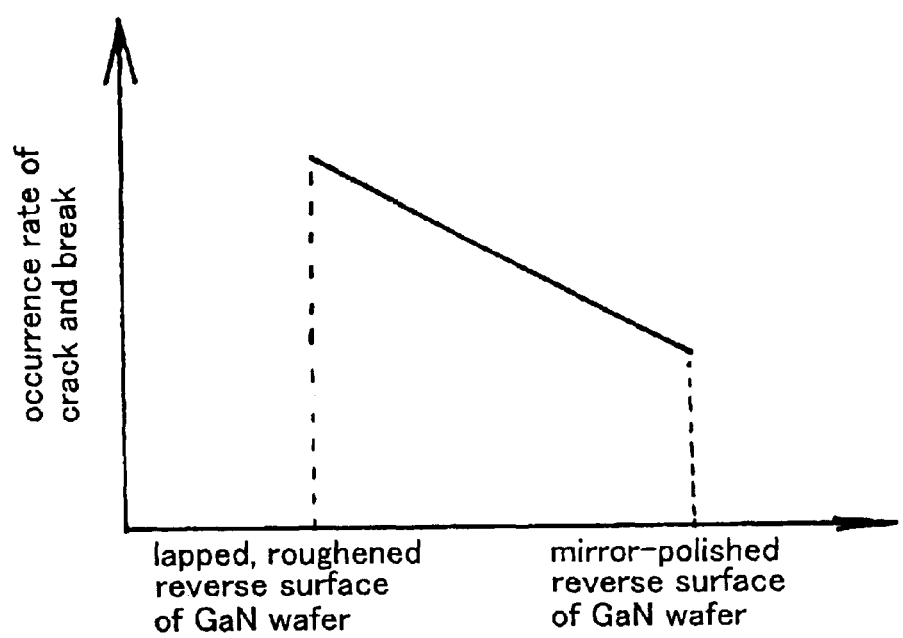

FIG. 15 is a graph showing measured crack/break occurrence rates of conventional reverse lapped rough wafers (left-hand) and reverse mirror-polished wafers (right-hand) of the present invention.

DETAILED DESCRIPTION OF THE PREFERRED EMBODIMENTS

The present invention makes longer/shorter neighboring slanting edges at corners aligning clockwise on an obverse surface of a rectangular nitride semiconductor wafer having a (0001) obverse surface (C-plane), a (11-20) side (A-plane) and a (1-100) side (M-plane).

Otherwise, the present invention makes an asymmetric slanting edge at a corner inclining at an angle between 5 degrees and 40 degrees to an obversely-counterclockwise side. These are geometrical obverse/reverse identification marks for finding an obverse surface by checking the order of longer/shorter edges or the inclination angle. Alternatively, the present invention makes asymmetric bevelling (chamfering) of different obverse bevelling width (g) and reverse bevelling width (h). Favorably, obverse bevelling (g) should be smaller than the reverse bevelling (h). A glimpse of side bevelling teaches an obverse surface.

Alternatively, the present invention writes a series of characters on an obverse or reverse surface in a normal or inverse posture, which includes four different types. Writing characters on wafers is called "marking". When a laser is used for writing characters, it is called "laser marking". Since nitride semiconductor wafers are transparent for visible light, characters written on one surface are clearly seen via another surface. In the case of opaque Si wafers, a tiny dot can be a sufficient obverse/reverse mark, since the dot cannot be seen via another surface. Transparency induces difficulty of writing character marks.

A rule should be predetermined for identifying obverse/reverse surfaces on transparent wafers. Transparency (poor absorption) causes difficulty of finding light power sources. The inventors found that high power $CO_2$ lasers of 10.6 $\mu$m, YAG second harmonic lasers and YAG third harmonic lasers are available. The inventors write dotted characters on GaN wafers by a $CO_2$ pulse laser of a 10.6 $\mu$m wavelength with one shot power of 15 mJ to 20 mJ. The characters are composed of a series of dots of a diameter between 100 $\mu$m and 140 $\mu$m.

A probable obverse/reverse mark is to write characters in normal posture on an obverse surface. In this case, when the characters are seen in normal posture, the current surface is an obverse surface and when the characters appear in inverse posture, the current surface is reverse. The obverse surface can be discriminated by detecting laser-burned dots. Otherwise, on-obverse, inverse-postural characters can be another obverse/reverse mark. When the characters are seen in normal posture, the current facing surface is reverse.

Another probable obverse/reverse identification mark is to write characters in normal posture on a reverse surface. In this case, when the characters stand in normal posture, the current facing surface is an obverse surface, and when the characters are seen in inverse posture, the facing surface is a reverse surface.

A fourth obverse/reverse mark is to write characters on inverse posture on a reverse surface. In this case, normal-postural characters mean an obverse surface and inverse-postural characters signify a reverse surface. Twelve representative types are described in more detail.

Figure 1:
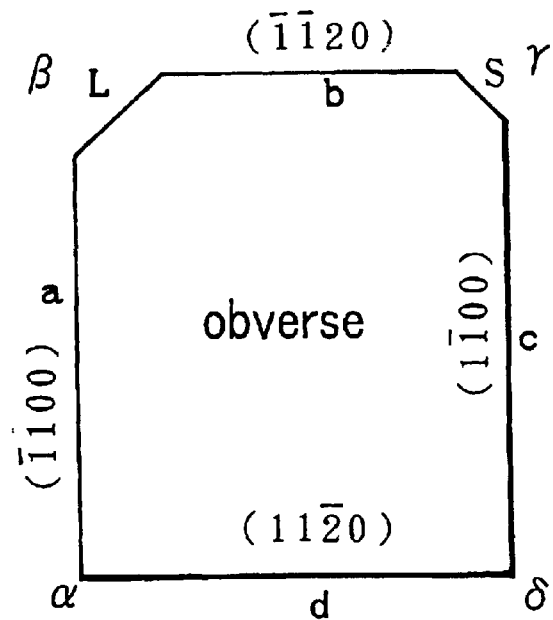
FIG. 1 is a plan view of a type 1 rectangular GaN wafer which has a (0001) obverse surface, a (000-1) reverse surface, a(-1100)-, b(-1-120)- and c(1-100)- and d(11-20)-sides, takes the d(11-20)-side as a reference side, makes a slanting longer edge L and a slanting shorter edge S by cutting clockwise in turn slantingly corners on the b(-1-120)-side opposite to the reference (11-20) side as an obverse/reverse discriminating mark. One can distinguish a top (0001) surface from a bottom (000-1) surface by keeping the GaN wafer with the reference side downward and confirming the longer edge and the shorter edge appearing clockwise on the upper (-1-120) side.

[Type 1 (clockwise aligning longer/shorter edges: FIG. 1)]

Type 1 and type 2 give an obverse/reverse discriminator of a set of clockwise neighboring longer and shorter edges on an obverse surface. When neighboring longer and shorter edges are clockwise lined up, the surface is obverse. When longer and shorter edges are counterclockwise aligned, the surface is reverse. Clockwise longer/shorter alignment denotes an obverse surface in Types 1 and 2. Counterclockwise longer/shorter alignment designates a reverse surface in Types 1 and 2.

Types 1 and 2 differ in a choice of a reference side.

Type 1 takes one of a conjugate set of (11-20) and (-1-120) as a reference side. Here, a case of the (11-20) reference side is described. FIG. 1 shows a GaN wafer having a (0001) obverse surface, a (000-1) reverse surface, a-side (-1100), b-side (-1-120), c-side (1-100), d-side (here: reference side), α-corner between a- and d-sides, β-corner between a- and b-sides, γ-corner between b- and c-sides, and δ-corner between c- and d-sides. Indefinite articles are omitted for confusing them with signs. Sides and corners align in the order α a β b γ c δ d clockwise on the obverse surface.

An obverse/reverse mark of type 1 is a set of a longer slanting edge formed on a left β-corner of the b-side and a shorter slanting edge formed on a right γ-corner of the b-side. When a longer edge (L) and a shorter edge (S) align clockwise on a surface of an object wafer, the current surface is an obverse surface. When a longer edge (L) and a shorter edge (S) line up counterclockwise, the current surface is a reverse surface.

Actually, the side having two slants is the b-side which is a sign-carrying side opposite of the reference side. When the reference side is positioned downward, two slants align on the above b-side. If the left slant is longer than the right slant, the wafer is upside-up. If the left slant is shorter than the right slant, the wafer is upside-down. Clockwise longer/shorter edge alignment means a current obverse surface.

Lengths of the slanting lines L and S should be restricted by inequalities of $S<L$, $K/40 \leq L \leq K/12$, and $K/40 \leq S \leq K/16$.

Here, K is a sum of lengths of the four sides.

Figure 2:
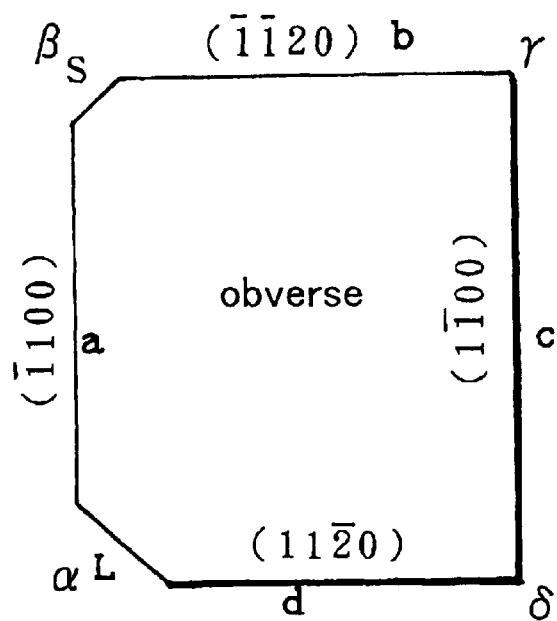
FIG. 2 is a plan view of a type 2 rectangular GaN wafer which has a (0001) obverse surface, a (000-1) reverse surface, a(-1100)-, b(-1-120)-, c(1-100)- and d(11-20)-sides, takes the c(1-100)-side as a reference side, makes a slanting longer edge L and a slanting shorter edge S by cutting slantingly clockwise in turn corners on a(-1100) side opposite to the reference (1-100) side as an obverse/reverse discriminating mark. One can distinguish a top (0001) surface from a bottom (000-1) surface by keeping the GaN wafer with the reference side (1-100) downward and confirming the longer edge and the shorter edge appearing clockwise on the upper (-1100) side.

[Type 2 (clockwise aligning longer/shorter edges: FIG. 2)]

Type 2 gives an obverse/reverse discriminator of clockwise aligning longer/shorter slants, which is similar to type 1.

Type 2 takes one of conjugate (1-100) and (-1100) sides as a reference side. Here, a case of the (1-100) reference side is described. FIG. 2 shows a rectangle GaN wafer having a (0001) obverse surface, a (000-1) reverse surface, a-side (-1100), b-side (-1-120), c-side (reference c) (1-100), d-side (11-20), α-corner between a- and d-sides, β-corner between a- and b-sides, γ-corner between b-and c-sides, and δ-corner between c- and d-sides. An obverse/reverse mark of type 2 is an obverse-clockwise aligning set of a longer slanting edge formed on a left α-corner of the a-side opposite to the reference side and a shorter slanting edge formed on a right corner (β) of the a-side. When a longer edge (L) and a shorter edge (S) align clockwise, the current surface is an obverse surface.

Lengths of the slanting lines L and S should satisfy inequalities of $S<L$, $K/40 \leq L \leq K/12$, and $K/40 \leq S \leq K/16$.

Here, K is a total of a peripheral length (a sum of lengths of the four sides).

Figure 3:
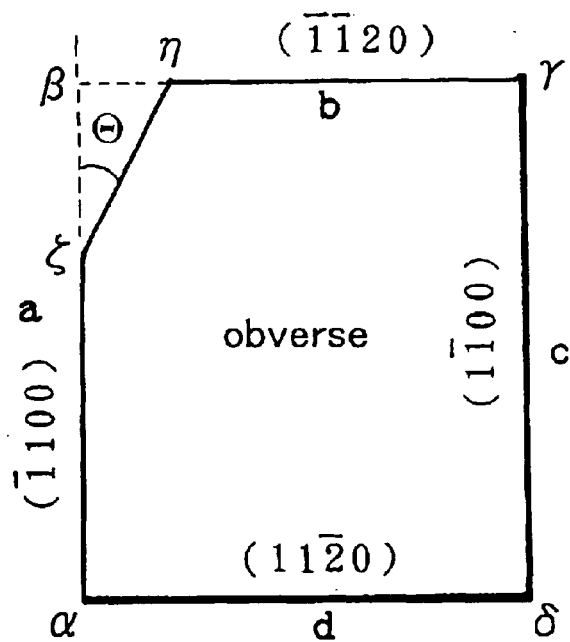
FIG. 3 is a plan view of a type 3 rectangular GaN wafer which has a (0001) obverse surface, a (000-1) reverse surface, a(-1100)-, b(-1-120)-, c(1-100)- and d(11-20)-sides, takes the d(11-20)-side as a reference side, makes an asymmetric slanting edge on a left corner β of the b(-1-120)-side opposite to the reference side (11-20) as an obverse/reverse orientation mark. The slanting edge inclines to the counterclockwise neighboring side (a) at a smaller angle Θ between 5 degrees and 40 degrees and inclines to the clockwise neighboring side (b) at a bigger angle between 85 degrees and 50 degrees. One can distinguish a top (0001) surface from a bottom (000-1) surface by keeping the GaN wafer with the reference (11-20) side (d) downward, maintaining the slanting edge appearing at a left corner on an upper side ((-1-120)-side) and confirming the edge angle to be less than 40 degrees at the counterclockwise neighboring side ((-1100)-side).

[Type 3 (single asymmetric slant edge: FIG. 3)]

A single asymmetric slant edge is a type 3 obverse/reverse discerning mark. The slant angle is not 45 degrees. A cut length of a counterclockwise neighboring side is longer than that of a clockwise neighboring side on an obverse surface. The same matter can be expressed by giving a smaller slanting angle of the edge to the counterclockwise neighboring side than that to the clockwise neighboring side on an obverse surface.

Concepts of the counterclockwise and clockwise sides depend upon an orientation of a wafer and are entirely reverse for an obverse surface and a reverse surface.

An object wafer is also a rectangle GaN wafer having a (0001) obverse surface, a (000-1) reverse surface, a(-1100)-side, b(-1-120)-side, c(1-100)-side and d(11-20)-side. The side signs a, b, c and d are clockwise numbered. Four corners are designated by α, β, γ and δ in the order of α a β b γ c δ d clockwise. Type 3 adopts one of the conjugate (-1-120) b-side and (11-20) d-side as a reference side. Type 3, here, takes the d-side (11-20) as a reference side which should be posed downward at the bottom for checking the obverse/reverse orientation.

FIG. 3 shows a top view of an example of type 3 taking the d-side as a reference. An asymmetric slanting edge η ζ is formed by eliminating a triangle fragment β η ζ from the left corner β of the b(-1-120)-side. The slant edge η ζ inclines to the obverse-counterclockwise neighboring a-side (-1100) at Θ which is smaller than 45 degrees. Θ should range from 5 degrees to 40 degrees ($5° \leq Θ \leq 40°$).

The slant η ζ inclines to the b-side at (90°-Θ) which is larger than 45 degrees. (90°-Θ) should range between 85 degrees and 50 degrees ($50° \leq 90°-Θ \leq 85°$).

When the wafer is posed upside up, a slanting edge inclines at an angle smaller to a counterclockwise neighboring side than to a clockwise neighboring side. When the wafer is posed upside down, a slanting edge inclines at an angle larger to a counterclockwise neighboring side than to a clockwise neighboring side. The direction of the asymmetric slant η ζ teaches the top(obverse) and the bottom (reverse) of a wafer.

Figure 4:
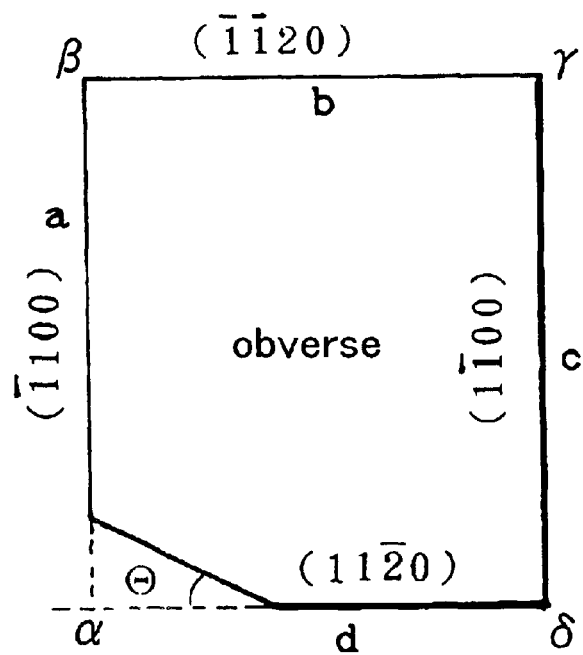
FIG. 4 is a plan view of a type 4 rectangular GaN wafer which has a (0001) obverse surface, a (000-1) reverse surface, a(-1100)-, b(-1-120)-, c(1-100)- and d(11-20)-sides, takes the c(1-100)-side as a reference side, makes an asymmetric slanting edge on a left corner α of the a(-1100)-side opposite to the reference side (1-100) as an obverse/reverse orientation mark. The slanting edge inclines to the counterclockwise neighboring side (d) at a smaller angle Θ between 5 degrees and 40 degrees and inclines to the clockwise neighboring side (a) at a bigger angle between 85 degrees and 50 degrees. One can distinguish a top (0001) surface from a bottom (000-1) surface by keeping the GaN wafer with the reference (1-100) side (c) downward, maintaining the slanting edge appearing at a left corner on an upper side ((-1100) side) and confirming the edge angle to be less than 40 degrees at the counterclockwise neighboring side ((11-20)-side).

[Type 4 (single asymmetric slant edge: FIG. 4)]

Similarly to type 3, a single asymmetric slanting edge is employed for signifying obverse/reverse discrimination. Type 4 adopts either a-side (-1100) or c-side (1-100) which is conjugate each other as a reference side. The c-side (1-100) is taken as a reference side, for example. As shown in FIG. 4, a mesa-side (a(-1100)) has an asymmetric slanting edge υ ξ at a left corner α. On an obverse surface, a slanting angle Θ to a counterclockwise neighboring side (d(11-20)) is smaller than another angle (90°-Θ) to a clockwise neighboring side (a(-1100)). A suitable range of Θ is between 5 degrees to 40 degrees. An eliminated fragment is a triangle α υ ξ. A counterclockwise eliminated length α υ is longer than another clockwise eliminated length ξ α. If the wafer is laid upside up, virtual longer/shorter eliminated lengths align clockwise.

Figure 5:
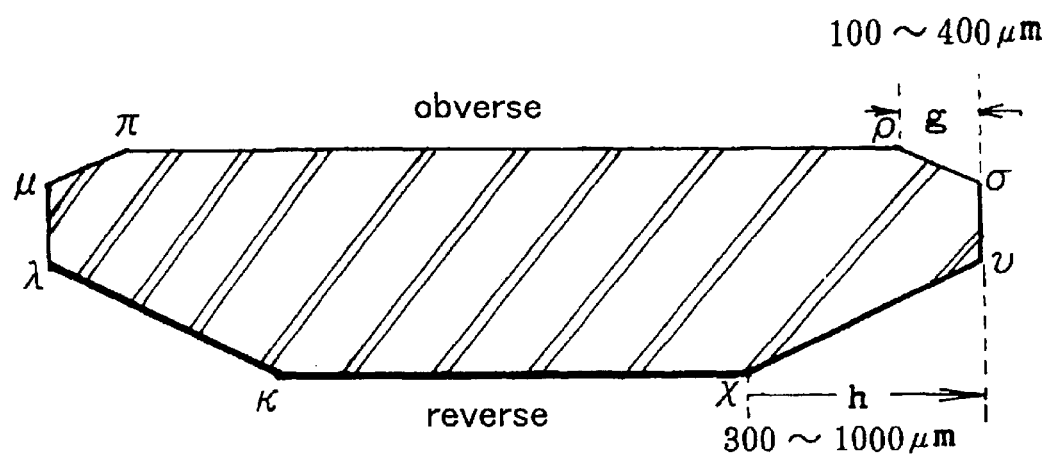
FIG. 5 is a sectional view of a type 5 rectangular GaN wafer which has an asymmetric bevelling comprising a narrower top periphery bevelling (g) and a wider bottom periphery bevelling (h). One can discriminate the obverse surface from the reverse surface by observing the bevelling peripheries (g) and (h) and confirming the upper bevelling (g) to be smaller than the lower bevelling (h).

[Type 5 (Different Bevelling Widths: FIG. 5)]

Type 5 gives a GaN wafer another obverse/reverse discriminator which makes use of different widths of bevelling (chamfering) of peripheries. Bevelling or chamfering is a process of polishing sharp edges of wafers slantingly for avoiding occurrence of scratches, splits or breaks of the wafers. FIG. 5 shows a vertically sectioned view of a type 5 GaN wafer. An obverse surface is denoted by μ, π, ρ and σ. A middle region π ρ is a flat obverse surface. Peripheries μ π and ρ σ on the top are narrower bevelled parts. A horizontal width (g) of the top bevelling portion μ π (or ρ σ) should range from 100 μm to 400 μm. Peripheries χ υ and κ λ on the bottom are wider bevelled parts. A horizontal width (h) of the bottom bevelled part λ κ (or χ υ) should range from 300 μm to 1000 μm. The top bevelling is smaller than the bottom bevelling in type 5. Difference of bevelling depths is the obverse/reverse discriminator in type 5. Asymmetry of the bevelling of type 5 discerns an obverse surface from a reverse surface. The bevelled belts μ π, ρ σ, χ υ and κ λ have smooth flat texture.

Figure 6:
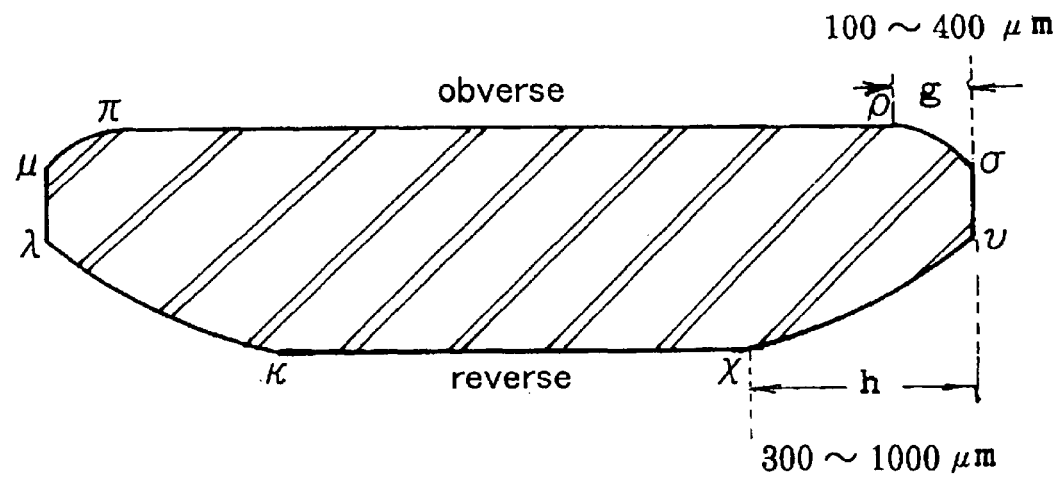
FIG. 6 is a sectional view of a type 6 rectangular GaN wafer which has an asymmetric bevelling comprising a narrower top round bevelling (g) and a wider bottom round bevelling (h). One can discriminate the obverse surface from the reverse surface by observing the bevellings (g) and (h) and confirming the upper bevelling (g) to be smaller than the lower bevelling (h).

[Type 6 (Different Round Bevelling Widths: FIG. 6)]

Similarly to type 5, difference of bevelling depths is an obverse/reverse identifying mark of a type 6 GaN wafer. FIG. 6 is a section of the type 6 wafer which has a round flat obverse surface π ρ, a flat smooth reverse surface κ, χ, a smooth round bottom bevelling λ κ and υ χ and a smooth round top bevelling μ π and ρ σ. The top (obverse) bevelling width of μ π and ρ σ should range from 100 μm to 400 μm in the horizontal direction. The bottom (reverse) bevelling width of λ κ and χ υ should be 300 μm to 1000 μm. The top bevelling width is smaller than the bottom bevelling width of λ κ and χ υ. One can discern the obverse surface from the reverse surface by making a glimpse of the edge of an object GaN wafer. The wafers of FIG. 5 and FIG. 6 are chamfered by fixing a GaN wafer on a mount, bringing it into contact with a 500 mm φ rotating whetting turntable implanted with whetting granules of GC#600 to #800, applying a pressure of about 300 gf, supplying whetting water and rotating the whetting turntable at a speed of 100 rpm. Type 6 is different from type 5 in bevelling edges into round peripheries.

Figure 7:
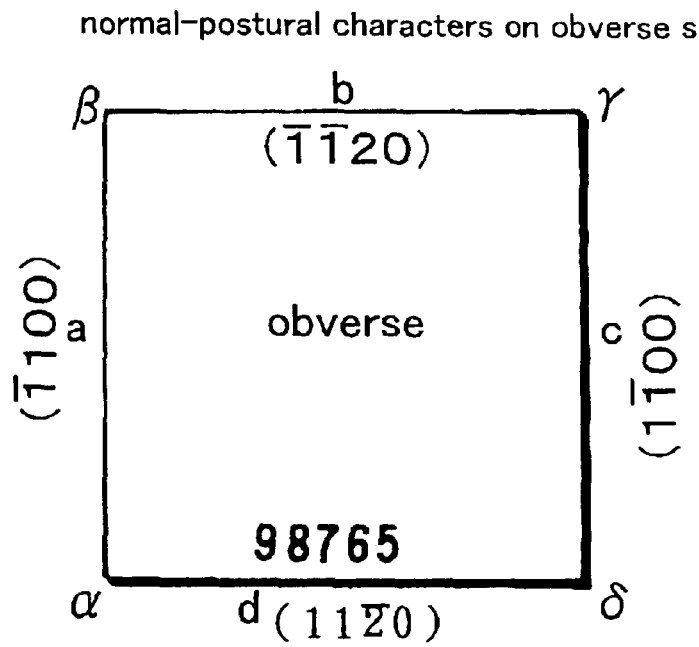
FIG. 7 is a plan view of a type 7 rectangular GaN wafer which has a (0001) obverse surface, a (000-1) reverse surface, (-1100)a-, (-1-120)b-, (1-100)c- and (11-20) d-sides, takes (11-20)d-side as a reference side, and has an obverse/reverse discriminating sign consisting of characters written along the (11-20) reference side in normal posture on the obverse surface. One can discriminate the obverse surface from the reverse surface by confirming the normal posture of the characters.

[Type 7 (Writing Normal-Postured Characters on Obverse Surface: FIG. 7)]

Type 7 proposes another obverse/reverse denoting mark which is a series of characters written in normal posture on an obverse surface. If marking characters are seen in normal posture, the current surface is a top (obverse). If marking characters appear in inverse posture, the current surface is a bottom (reverse).

FIG. 7 is a top view of a type 7 wafer having a (0001) obverse surface, a (000-1) reverse surface, a(-1100)-side, b(-1-120)-side, c(1-100)-side, d(11-20)-side and corners α, β, γ and δ. The corners and sides are arranged in a series of α, a, β, b, γ, c, δ and d in a clockwise direction. The (11-20) d-side is taken as a reference side. Normal-postural characters are written on the top along the reference side d(11-20).

GaN is transparent for visible light. Visible light lasers are incompetent. Infrared light of a wavelength longer than 5000 nm or ultraviolet rays shorter than 400 nm is absorptive. A high power $CO_2$ pulse laser, second harmonics of a pulsating YAG laser or third harmonics of a pulsating YAG laser is available for writing characters composed of small dots.

Since GaN is transparent, inverse-postural characters can be seen from the bottom. The posture of the characters shows that the current surface is a top or a bottom. Since type 7 discriminates obverse/reverse surfaces by the posture of characters, an asymmetric character or asymmetric series of characters should be selected. Numerals, alphabets, Chinese characters or any other symbols are available for the obverse/reverse identification.

Figure 8:
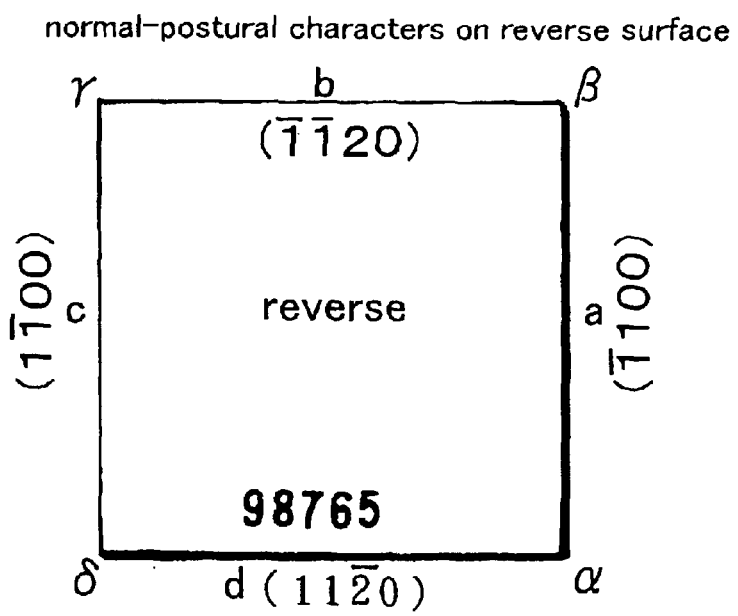
FIG. 8 is a bottom view of a type 8 rectangular GaN wafer which has a (0001) obverse surface, a (000-1) reverse surface, (-1100)a-, (-1-120)b-, (1-100)c- and (11-20) d-sides, takes (11-20)d-side as a reference side, and has an obverse/reverse discriminating sign consisting of characters written along the (11-20) reference side in normal posture on the reverse surface. One can discriminate the obverse surface from the reverse surface by confirming the characters scribed on the reverse surface in the normal posture.

[Type 8 (Writing Normal-Postured Characters on Reverse Surface: FIG. 8)]

Type 8 writes a series of normal-postural characters on a reverse surface. If marking characters are seen in normal posture, the current surface is a bottom. If marking characters appear in inverse posture, the current surface is a top.

FIG. 8 is a bottom view of a type 8 wafer having a (000-1) reverse surface, α-corner, a(-1100)-side, β-corner, b(-1-120)-side, γ-corner, c(1-100)-side, δ-corner and d (11-20)-side which are arranged in this turn in a counterclockwise order on the reverse surface. The d(11-20)-side is taken as a reference side. Characters are written in normal posture on the bottom (reverse) surface in parallel with the reference side d(11-20) in a [1-100] direction. Since GaN is transparent, inverse-postural characters can be seen from the top (obverse). The posture of the characters shows that the current surface is a reverse (bottom) or an obverse (top).

Figure 9:
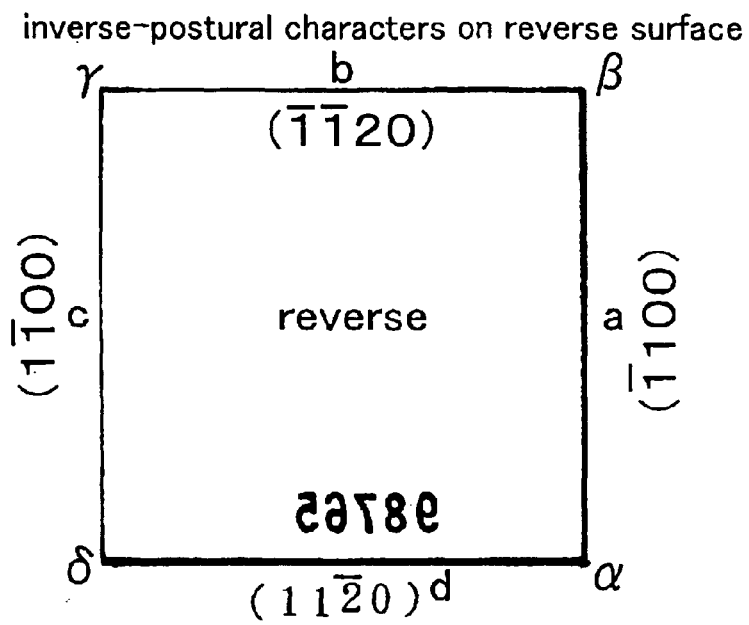
FIG. 9 is a bottom view of a type 9 rectangular GaN wafer which has a (0001) obverse surface, a (000-1) reverse surface, (-1100)a-, (-1-120)b-, (1-100)c- and (11-20)

[Type 9 (Writing Inverse-Postured Characters on Reverse Surface: FIG. 9)]

Type 9 writes a series of inverse-postural characters on a reverse surface. If marking characters are seen in normal posture, the current surface is obverse. If marking characters appear in inverse posture, the current surface is a reverse one.

FIG. 9 is a bottom view of a type 9 wafer having a (000-1) reverse surface, α-corner, a(-1100)-side, β-corner, b(-1-120)-side, γ-corner, c(1-100)-side, δ-corner and d(11-20)-side which are arranged in this turn in a counterclockwise order on the reverse surface. The d(11-20)-side is taken as a reference side. Characters are written in inverse posture on the bottom (reverse) surface in parallel with the reference side d(11-20) in a [1-100] direction. Type 9 has an advantage not to hurt an important obverse surface.

Besides types 7, 8 and 9, there is another type of writing inverse-postural characters on an obverse surface in parallel with a reference d(11-20) side in a [1-100] direction. Though such a type is neither shown in a figure and is nor described here for avoiding repetition, anybody can easily understand from types 7, 8 and 9.

[Type 10 (Writing Normal-Postured Characters on Obverse Surface: FIG. 10)]

Types 10, 11 and 12 are similar to the described types 7, 8 and 9 which discern the obverse/reverse by the posture of laser-marked characters. Types 10 to 12 take c(1-100) side as a reference side. FIG. 10 shows a rectangle GaN wafer having an obverse surface, a(-1100)-, b(-1-120)-, c(1-100)-, d(11-20)-sides and characters written by laser-marking in normal posture on an obverse surface in parallel with the c(1-100) as a reference in a [11-20] direction. If the characters are seen in normal posture, the current surface is obverse. If the characters are seen in inverse posture, the present surface is reverse.

[Type 11 (Writing Normal-Postured Characters on Reverse Surface: FIG. 11)]

Types 11 takes c(1-100) side as a reference and writes characters in normal posture on a reverse surface by laser marking. FIG. 11 shows this type having a (000-1) reverse surface, (11-20) and (1-100) sides and a series of characters in parallel with the reference c(1-100) side in a [11-20] direction. If the characters are seen in normal posture, the current surface is reverse. If the characters are seen in inverse posture, the present surface is obverse.

[Type 12 (Writing Inverse-Postured Characters on Reverse Surface: FIG. 12)]

Types 12 takes c(1-100) side as a reference and writes characters in inverse posture on a reverse surface by laser marking. FIG. 12 shows this type having a series of inverse-postural characters in parallel with the reference c(1-100) side in a [11-20] direction. If characters are seen in normal posture, the current surface is obverse. If characters are seen in inverse posture, the present surface is reverse.

What we claim is:

1. An obverse/reverse discriminative rectangular nitride semiconductor wafer having:
    an obverse surface of (0001) or (000-1);
    (11-20) and (1-100) sides; and
    a longer slanting edge (L) and a shorter slanting edge (S) formed at two obversely-clockwise neighboring corners on a side opposite to the (11-20) side as a reference side.

2. The obverse/reverse discriminative rectangular nitride semiconductor wafer according to claim 1, wherein lengths of the longer slanting edge (L) and the shorter slanting edge (S) satisfy inequalities $S<L$, $K/40 \leq L \leq K/12$ and $K/40 \leq S \leq K/16$, where K is a sum of lengths of four sides of the rectangular wafer.

3. An obverse/reverse discriminative rectangular nitride semiconductor wafer having:
    an obverse surface of (0001) or (000-1);
    (11-20) and (1-100) sides; and
    a longer slanting edge (L) and a shorter slanting edge (S) formed at two obversely-clockwise neighboring corners on a side opposite to the (1-100) side as a reference side.

4. The obverse/reverse discriminative rectangular nitride semiconductor wafer according to claim 3, wherein lengths of the longer slanting edge (L) and the shorter slanting edge (S) satisfy inequalities S<L, K/40≦L≦K/12 and K/40≦S≦K/16, where K is a sum of lengths of four sides of the rectangular wafer.

5. An obverse/reverse discriminative rectangular nitride semiconductor wafer having:
   an obverse surface of (0001) or (000-1);
   (11-20) and (1-100) sides; and
   an asymmetric slanting edge formed at an obverse-counterclockwise corner of a (−1-120) side opposite to the (11-20) side as a reference side,
   the asymmetric slanting edge inclining to an obverse-counterclockwise neighboring side at an angle Θ between 5 degrees and 40 degrees (5°≦Θ≦40°) and having a length between K/40 and K/16, where K is a sum of lengths of four sides of the rectangular wafer.

6. An obverse/reverse discriminative rectangular nitride semiconductor wafer having:
   an obverse surface of (0001) or (000-1);
   (11-20) and (1-100) sides; and
   an asymmetric slanting edge formed at an obverse-counterclockwise corner of a (−1100) side opposite to the (1-100) side as a reference side,
   the asymmetric slanting edge inclining to an obverse-counterclockwise neighboring side at an angle Θ between 5 degrees and 40 degrees (5°≦Θ≦40°) and having a length between K/40 and K/16, where K is a sum of lengths of four sides of the rectangular wafer.

7. An obverse/reverse discriminative rectangular nitride semiconductor wafer having:
   an obverse surface of (0001) or (000-1); and
   (11-20) and (1-100) sides,
   wherein the sides are bevelled asymmetrically for an obverse and a reverse and an obverse bevelling width (g) is smaller than a reverse bevelling width (h).

8. The obverse/reverse discriminative rectangular nitride semiconductor wafer according to claim 7, wherein the obverse bevelling width (g) and the reverse bevelling with (h) satisfy inequalities of g<h, 100 μm≦g≦400 μm and 300 μm ≦h≦1000 μm.

9. An obverse/reverse discriminative rectangular nitride semiconductor wafer having:
   an obverse surface of (0001) or (000-1);
   (11-20) and (1-100) sides; and
   characters written in normal posture on the obverse surface in parallel with the (11-20) side along a [1-100] direction by laser marking.

10. An obverse/reverse discriminative rectangular nitride semiconductor wafer having:
    an obverse surface of (0001) or (000-1);
    (11-20) and (1-100) sides; and
    characters written in inverse posture on the obverse surface in parallel with the (11-20) side along a [1-100] direction by laser marking.

11. An obverse/reverse discriminative rectangular nitride semiconductor wafer having:
    an obverse surface of (0001) or (000-1);
    a reverse surface opposite to the obverse surface;
    (11-20) and (1-100) sides; and
    characters written in normal posture on the reverse surface in parallel with the (11-20) side in a [1-100] direction by laser marking.

12. An obverse/reverse discriminative rectangular nitride semiconductor wafer having:
    an obverse surface of (0001) or (000-1);
    a reverse surface opposite to the obverse surface;
    (11-20) and (1-100) sides; and
    characters written in inverse posture on the reverse surface in parallel with the (11-20) side in a [1-100] direction by laser marking.

13. An obverse/reverse discriminative rectangular nitride semiconductor wafer having:
    an obverse surface of (0001) or (000-1);
    (11-20) and (1-100) sides; and
    characters written in normal posture on the obverse surface in parallel with the (1-100) side in a [11-20] direction by laser marking.

14. An obverse/reverse discriminative rectangular nitride semiconductor wafer having:
    an obverse surface of (0001) or (000-1);
    (11-20) and (1-100) sides; and
    characters written in inverse posture on the obverse surface in parallel with (1-100) side in a [11-20] direction by laser marking.

15. An obverse/reverse discriminative rectangular nitride semiconductor wafer having:
    an obverse surface of (0001) or (000-1);
    a reverse surface opposite to the obverse surface;
    (11-20) and (1-100) sides; and
    characters written in normal posture on the reverse surface in a [11-20] direction in parallel with the (1-100) side by laser marking.

16. An obverse/reverse discriminative rectangular nitride semiconductor wafer having:
    an obverse surface of (0001) or (000-1);
    a reverse surface opposite to the obverse surface;
    (11-20) and (1-100) sides; and
    characters written in inverse posture on the reverse surface in a [11-20] direction in parallel with the (1-100) side by laser marking.

* * * * *